(12) United States Patent
Zhao

(10) Patent No.: US 8,456,163 B2
(45) Date of Patent: Jun. 4, 2013

(54) VARIABLE IMAGE RESOLUTION MR IMAGING SYSTEM

(75) Inventor: Tiejun Zhao, Pittsburgh, PA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 442 days.

(21) Appl. No.: 12/727,275

(22) Filed: Mar. 19, 2010

(65) Prior Publication Data

US 2011/0006765 A1    Jan. 13, 2011

Related U.S. Application Data

(60) Provisional application No. 61/224,669, filed on Jul. 10, 2009.

(51) Int. Cl.
*G01R 33/44* (2006.01)
*G01R 33/48* (2006.01)

(52) U.S. Cl.
USPC ............ 324/309; 324/307; 324/318; 600/415

(58) Field of Classification Search
USPC .... 324/300–322; 600/407–464; 382/128–132
See application file for complete search history.

(56) References Cited

U.S. PATENT DOCUMENTS

| 5,532,595 A * | 7/1996 | Lampman et al. ............ 324/309 |
| 2008/0258727 A1 | 10/2008 | Qian et al. |
| 2009/0134872 A1* | 5/2009 | Brau et al. .................... 324/309 |
| 2010/0205143 A1* | 8/2010 | Kroeker et al. ............... 707/602 |

* cited by examiner

*Primary Examiner* — Jermele M Hollington
*Assistant Examiner* — Emily Chan
(74) *Attorney, Agent, or Firm* — Alexander J Burke

(57) ABSTRACT

A system acquires frequency domain components representing MR image data. An RF coil emits RF pulses for use in acquiring multiple individual frequency components corresponding to individual data elements in a 3D storage array in which the individual frequency components are successively acquired along radii from a designated center representing an origin to a boundary of the storage array. Angles of successive radii with respect to the origin are successively changed to substantially fill the storage array volume during acquisition of an MR dataset representing an MR image. A computation processor determines the angles of successive radii with respect to the origin, in response to data representing a reduction in at least one dimension of the 3D imaging volume represented by the storage array. A storage processor stores individual frequency components, acquired using the emitted RF pulses, in corresponding individual data elements in the array.

13 Claims, 6 Drawing Sheets

ISOTROPIC K-SPACE

OBLATED K-SPACE

VARIABLE IMAGE RESOLUTION MR IMAGING SYSTEM

This is a non-provisional application of provisional application Ser. No. 61/224,669 filed 10 Jul., 2009, by T. Zhao.

FIELD OF THE INVENTION

This invention concerns a system for successively acquiring MR image frequency domain components along radii from a designated center of a storage array (e.g., k-space) to a boundary of the storage array and angles of successive radii with respect to the origin are successively changed to substantially fill the storage array volume during acquisition of an MR dataset.

BACKGROUND OF THE INVENTION

Tissues, such as cortical bone, tendons, ligaments, menisci and periosteum, have short T2 relaxation components that need an ultra-short TE (UTE) MR imaging pulse sequence for their detection. The basic 3D UTE pulse sequence involves using a short RF excitation pulse and center out radial imaging with options that suppress fat and/or long T2 components. Compared to 2D UTE sequences, partial saturation by multi-slice imaging of short T2 components are minimized. However, known MR imaging systems typically use a 3D radial (e.g., center out) scan having isotropic resolution and thus require a prolonged long scan time and with limited in-plane resolution. A system according to invention principles addresses these deficiencies and related problems.

SUMMARY OF THE INVENTION

An MR imaging system employs a K-space sampling process to provide non-isotropic resolutions for short or ultra-short TE (Echo Time) imaging. A system for acquiring frequency domain components representing MR image data for storage in an array includes an RF coil. The RF coil emits RF pulses for use in acquiring multiple individual frequency components corresponding to individual data elements in a 3D storage array in which the individual frequency components are successively acquired along radii from a designated center representing an origin to a boundary of the storage array. Angles of successive radii with respect to the origin are successively changed to substantially fill the storage array volume during acquisition of an MR dataset representing an MR image. A computation processor determines the angles of successive radii with respect to the origin, in response to data representing a reduction in at least one dimension of the 3D imaging volume represented by the storage array. A storage processor stores individual frequency components, acquired using the emitted RF pulses, in corresponding individual data elements in the array.

DETAILED DESCRIPTION OF THE INVENTION

An MR imaging system according to invention principles employs a k-space sampling process to provide non-isotropic resolutions for short or ultra-short TE (Transverse Excitation) imaging. The system advantageously employs a k-space image sampling process to realize a non-isotropic 3D radial scan to reduce scan time or to achieve higher in plane resolution. The system may be readily incorporated into existing 3D UTE pulse sequence implementations. The system advantageously acquires radially scanned image components for storage. Non-isotropic 3D image resolutions may be used to reduce scan time and/or achieve high in plane image resolution with a thicker slice thickness. The system provides a k-space sampling strategy to realize desired non-isotropic image resolutions for short or ultra-short TE imaging and may be used to reduce the scan time or achieve higher in plane resolution. K-space is the temporary image space in which data from digitized MR signals is stored during data acquisition and comprises raw data in a spatial frequency domain before reconstruction. When k-space is full (at the end of an MR scan), the data is mathematically processed to produce a final image.

Figure 1:
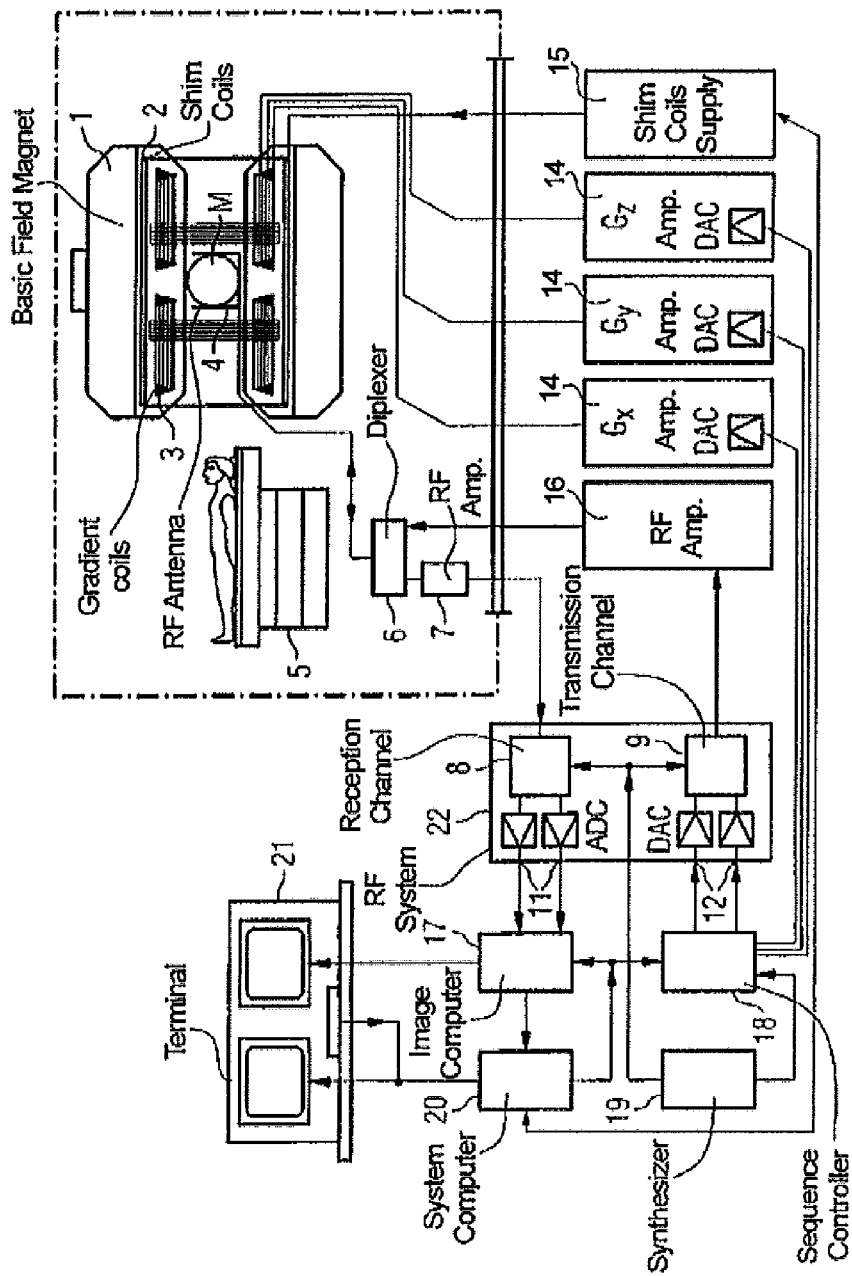
FIG. 1 shows a system for acquiring frequency domain components representing MR image data for storage in an array, according to invention principles.

FIG. 1 is a schematic block diagram of a system 10 including a magnetic resonance tomography device with which MR images can be acquired according to principles of the present invention. A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

System computer 20 automatically (or in response to user command entered via terminal 21) employs and directs the MR imaging device of system 10 in acquiring frequency domain components representing MR image data for storage in a k-space array. RF coils 4 emits RF pulses for use in acquiring multiple individual frequency components corresponding to individual data elements in a 3D storage array in which the individual frequency components are successively acquired along radii from a designated center representing an origin to a boundary of the storage array. Angles of successive radii with respect to the origin are successively changed to substantially fill the storage array volume during acquisition of an MR dataset representing an MR image. A computation processor in computer 20 determines the angles of successive radii with respect to the origin, in response to data representing a reduction in at least one dimension of the 3D imaging volume represented by the storage array. A storage processor in computer 20 stores individual frequency components, acquired using the emitted RF pulses, in corresponding individual data elements in the array. An image generator of imaging computer 17 generates an MR image using an acquired MR image dataset for display on a reproduction device (e.g., terminal 21).

System 10 uses magnetic field gradients and radio frequency excitation to create an image. A 3D radial imaging scan involves an RF pulse for excitation followed by acquisition of a radial image scan line for storage in k-space. For a UTE sequence, center out radial scanning is used to minimize echo time (TE). System computer 20 translates acquired k-space data onto a Cartesian grid and a Three-Dimensional Fourier Transform (3DFT) method is used to process the data to form a final image.

Figure 2:
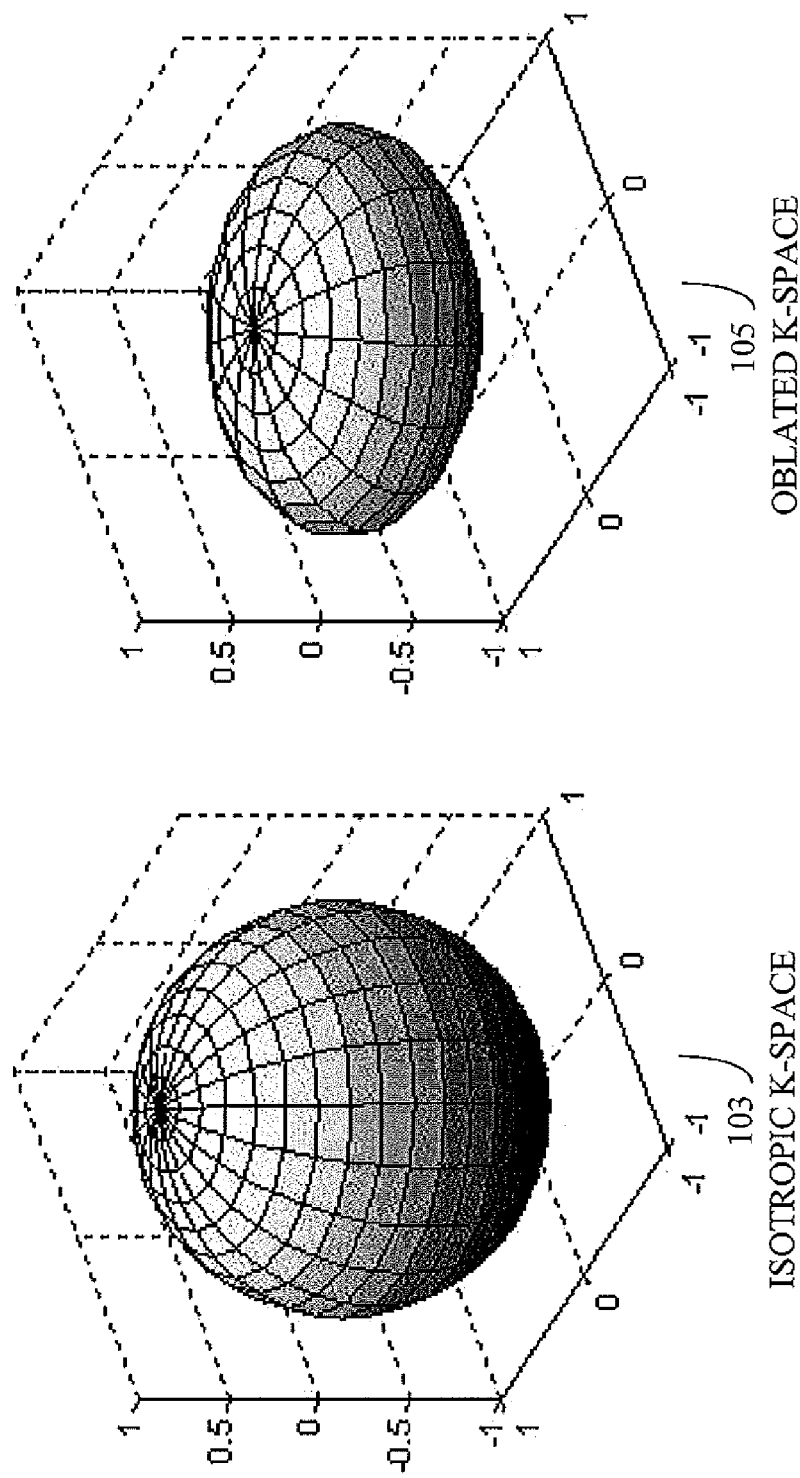
FIG. 2 illustrates a 3D k-space volume comprising a sphere and oblate sphere, according to invention principles.

FIG. 2 illustrates a 3D k-space volume comprising a sphere 103 and oblate sphere 105. Isotropic as used herein means having substantially the same image resolution (pixels per image) in the direction of the different imaging axes. Non-isotropic means having substantially different image resolution (pixels per image) in at least one direction of the different imaging axes. Sphere 103 and oblate sphere 105 are depicted by following Equation 1 and Equation 2, respectively. K-space for a 3D radial image scan covers sphere 103 in k-space as represented by $$\left(\frac{k_x}{k_{Max}}\right)^2 + \left(\frac{k_y}{k_{Max}}\right)^2 + \left(\frac{k_z}{k_{Max}}\right)^2 = 1 \tag{1}$$

Isotropic image resolution is normal. In order to generate an image without under-sampling artifacts, the end of a radial k-space line needs to cover the sphere surface with reduced resolution. Normally, the sphere surface is uniformly covered. In this case, the required number of radial projections, $N_r$, without k-space under-sampling is equal to pi*N, where N is the number of total Cartesian scan lines. However, if it is preferred to have lower resolution in the slice directions to reduce the slice phase encoding steps (thus, the total time), an oblate k-sphere is imaged.

$$\left(\frac{k_x}{k_{Max}}\right)^2 + \left(\frac{k_y}{k_{Max}}\right)^2 + \left(\frac{k_z}{k_{z,Max}}\right)^2 = 1 \tag{2}$$

Figure 3:
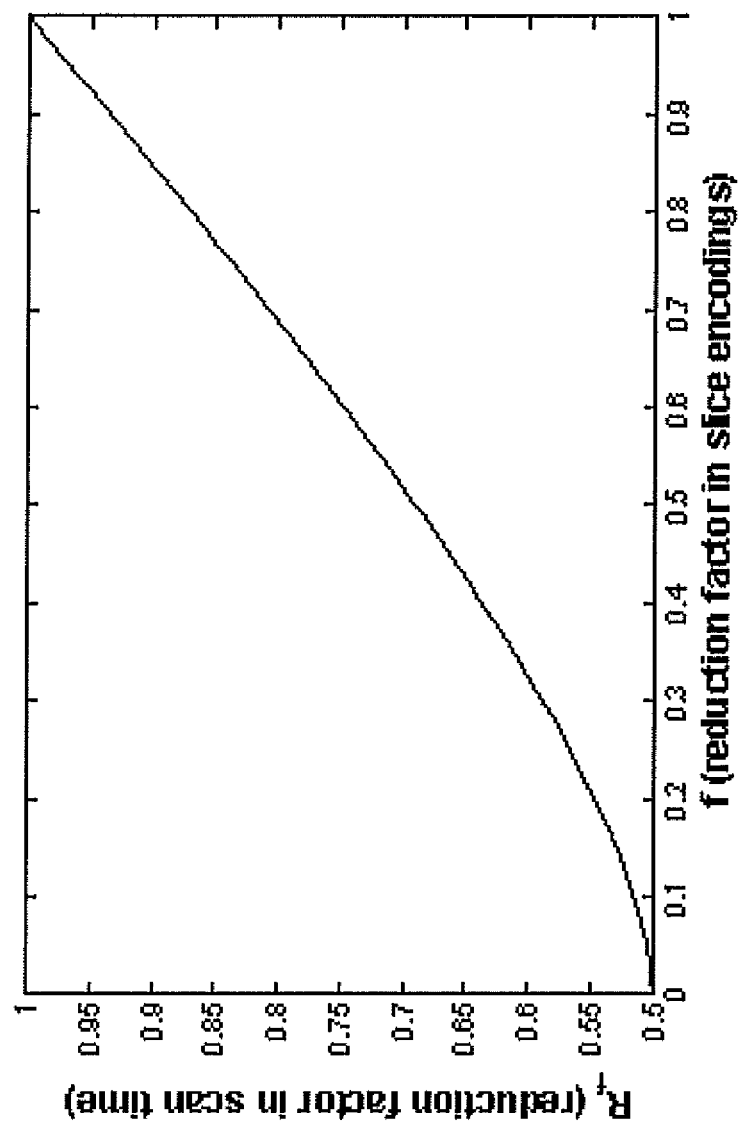
FIG. 3 shows a plot of scan time reduction factor against slice encoding reduction factor for a reduction in k-space volume, according to invention principles.

That is the $k_{z,max}$ is smaller than the $k_{max}$ in the readout and phase encoding directions. Therefore, $$k_{z,Max} = f \times k_{Max} \tag{3}$$

Where f is the reduction factor for the k-space coverage. In this case, it is desired to uniformly cover the oblate sphere surface as shown in FIG. 1 to fully sample the k-space. The required total radial projects, $N_{r,new}$, is given as, $$N_{r,new} = N_r \frac{S_{OblatedSphere}}{S_{Sphere}} = N_r R_f \quad (4)$$

Where $S_{OblatedSphere}$ and $S_{sphere}$ are the surface area of the oblate sphere and sphere, respectively. Since the oblate sphere has lower surface area, the total scan time can thus be reduced by a factor of $R_f$. FIG. 3 shows the time saved by using this method with different reduction factor in k-space coverage along the slice direction.

FIG. 3 shows a plot of scan time reduction factor (x-axis) against slice encoding reduction factor (y-axis) for a reduction in k-space volume. As shown in FIG. 3, the process is effective with reduction factor f>0.35 for reducing the MR scan time. For example, if a field of view (FOV) in the slice encoding direction and the resolution is half of the FOV in the readout and phase-encoding directions (f=0.5), the Rf=0.69. That is, the total scan time is reduced by approximately 30%. The scan time reduction system provides non-isotropic resolution in a 3D radial scan, which is used to reduce scan time or to achieve higher in plane resolution and is readily employed with an existing 3D radial UTE pulse sequence. The scan time reduction system provides non-isotropic resolution 3D radial scanning for short and ultra-short TE MR imaging by reducing resolution or slice thickness of an imaged volume in at least one axis. In one embodiment the system reduces volume in one axis but maintains image resolution.

Three dimensional (3D) k-space comprises a three dimensional storage array of individual data elements for storing corresponding individual frequency components comprising an MR dataset. The array of individual data elements has a designated center and individual data elements individually have a radius to the designated center. Radial imaging comprises acquiring individual frequency components corresponding to individual data elements in 2D or 3D k-space on a radial trajectory from the designated center to a circle or sphere surface. Frequency components are successively acquired on multiple radial trajectories at incrementally changing angles from the origin at the center until the 2D or 3D k-space is radially filled using a one dimensional magnetic field gradient, applied at varying angles. Radial MRI is typically used for scans that are sensitive to unavoidable motion and/or to achieve short echo time.

The scan time reduction system may be advantageously used with a reduced FOV Field of View) in the slice direction so that less partition encodings are needed to achieve the same slice resolution (that is, slice thickness) along the slice direction. The system may also be advantageously used to reduce MR imaging scan-time. Further, for the same FOV in the slice direction, the system enables a user to reduce the slice resolution (that is, a thicker slice thickness with fewer partition encodings). In this case, the in-plane resolution may be increased due to an increased slice thickness and thus more signal-to-noise ratio.

Individual frequency components are successively acquired along radii from a designated center representing an origin of a 3D (e.g., k-space) storage array to a boundary of the storage array and angles of successive radii with respect to the origin are successively changed to substantially fill the storage array volume during acquisition of an MR dataset representing an MR image. In one embodiment a computation processor dynamically determines the angles of successive radii by first uniformly distributing the angles along an ellipse in a Kz-Kx plane and by rotating. radii around the Kz axis to form a cone. The computation processor dynamically determines lengths of the successive radii based on cone angle relative to Kz axis.

Figure 4:
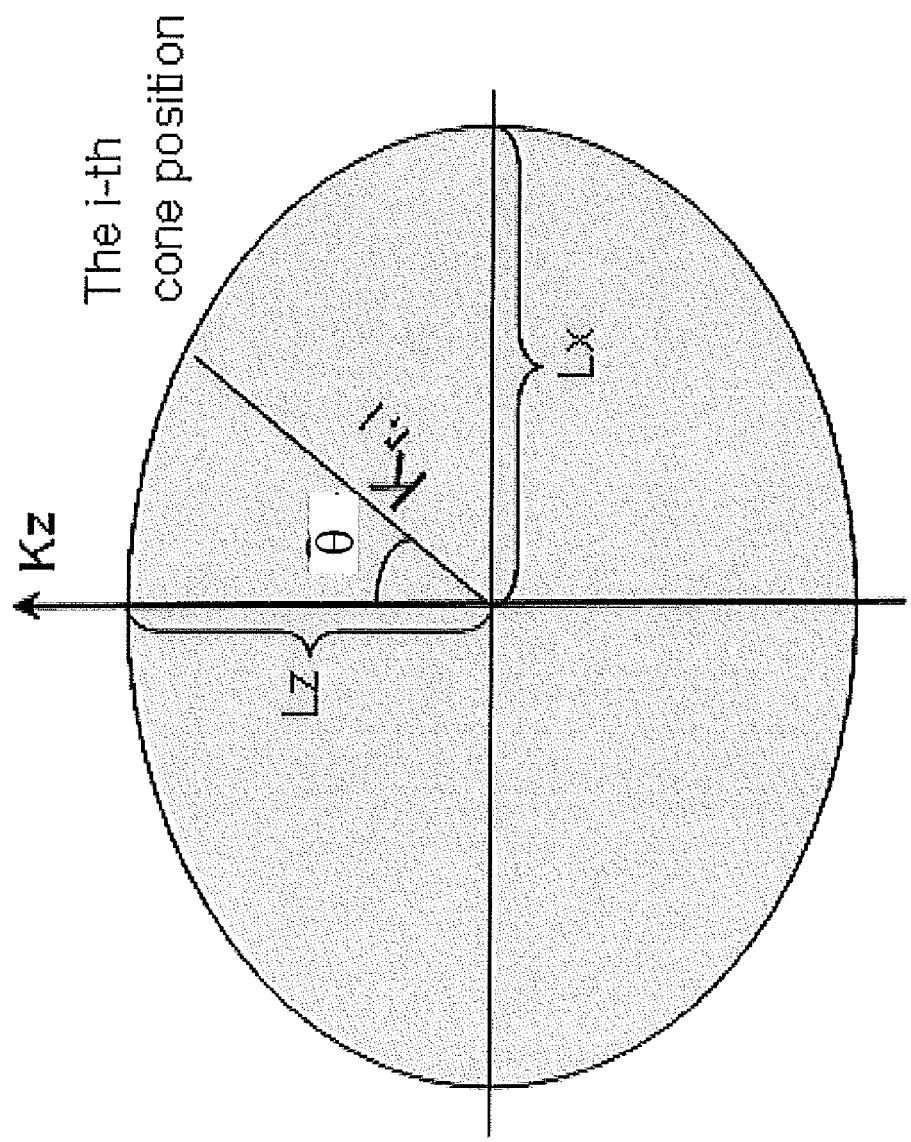
FIG. 4 shows angle and length of a cone in an embodiment in which cones are used to cover a k-space volume surface, according to invention principles.

In one embodiment, the surface of oblate sphere 105 (FIG. 1) is covered uniformly by cones. The angle and length of the i-th cone, $L_x$ and $L_z$ are the maximum values of k-space along the x and z directions, respectively. FIG. 4 shows angle and length of a cone in an embodiment in which cones are used to cover a k-space volume surface. The angle of the i-th cone relative to the $K_z$ axis, $\theta_i$, is calculated as follows, (1) Calculate a total length, $L_{tot}$, from North Pole ($\theta$=0) to South Pole ($\theta$=pi) along longitude circle as in FIG. 2. In the polar coordinate, $K_z = L_z \cos(\theta)$ and $K_x = L_x \sin(\theta)$, where $L_x$ and $L_z$ are length of the Kx and Kz axis for the k-space sphere as shown in FIG. 2. At the given polar angle, $\theta$, the radius at that angle is calculated as $K_r = (K_x^2 + K_z^2)^{0.5}$. With these equations, the $L_{tot}$ is given as, $$L_{tot} = \int_0^{pi} K_r(\theta)d\theta \approx \sum_i K_r(\theta_i)(\theta_{i+1} - \theta_i).$$

The integral equation is made discrete for the numerical calculation.

(2) Determine a unit length, $L_{unit}=2*L_x/N$, where N is the base resolution along $K_x$ (or $K_y$).

(3) Determine the total number of needed cones, $N_{cone}$, by, $$N_{cone} = \frac{L_{tot}}{2 \times L_{unit}},$$

where the $L_{tot}$ and $L_{unit}$ as defined in (1) and (2) above. One cone corresponds to a latitude circle as shown in FIG. 2. Since the resolution in the $K_x$ (or $K_y$) direction is higher than the $K_z$ direction, the $L_{unit}$ gives the minimal length required to fulfill the sampling rate for the two neighbor sampling data points on the surface. Thus, the calculated $N_{cone}$ is the upper limit of number of cones needed to fulfill the Nyquist criteria.

(4) Determine the cone position $\theta_i$, by numerical integration starting from the North Pole so that the length from $\theta_{i-1}$ to $\theta_i$ equals $L_{unit}$ or the approximate solution as described below can be applied. That is, $$L_{unit} = \int_{\theta_{i-1}}^{\theta_i} K_r(\theta)d\theta \approx K_r(\theta_i)(\theta_{i+1} - \theta_i)$$

Approximately, $$\theta_{i+1} = \theta_i + \frac{L_{unit}}{K_r(\theta_i)} = \theta_i + \frac{L_{unit}}{\sqrt{L_z^2 \cos^2\theta_i + L_x^2 \sin^2\theta_i}}$$

With the initial value, $\theta_1=0$ and end condition $\theta<\pi$. The $\theta$ array is determined iteratively. That is, $$\theta_1 = 0$$

$$\theta_2 = \theta_1 + \frac{L_{unit}}{K_r(\theta_1)}$$

$$\theta_3 = \theta_2 + \frac{L_{unit}}{K_r(\theta_2)}$$

...

(5) For the given cone ($\theta_i$), the number of needed rotations, $N_r$, (that is, the sampled data points on a specific cone or a latitude cycle) can be calculated as $$N_r = \frac{S_i}{L_{unit}^2},$$

where $S_i$ is the total surface area between $\theta_{i+1}$ and $\theta_i$ (that is, the area between the $(i+1)^{th}$ and $i^{th}$ cones), which can be calculated using numerical integrations or using the approximate solutions with the following equations.

$$S_i = 2\pi K_r(\theta_i)\sin(\theta_i)(K_r(\theta_{i+1})\sin(\theta_{i+1}) - K_r(\theta_i)\sin(\theta_i))$$

Figure 5:
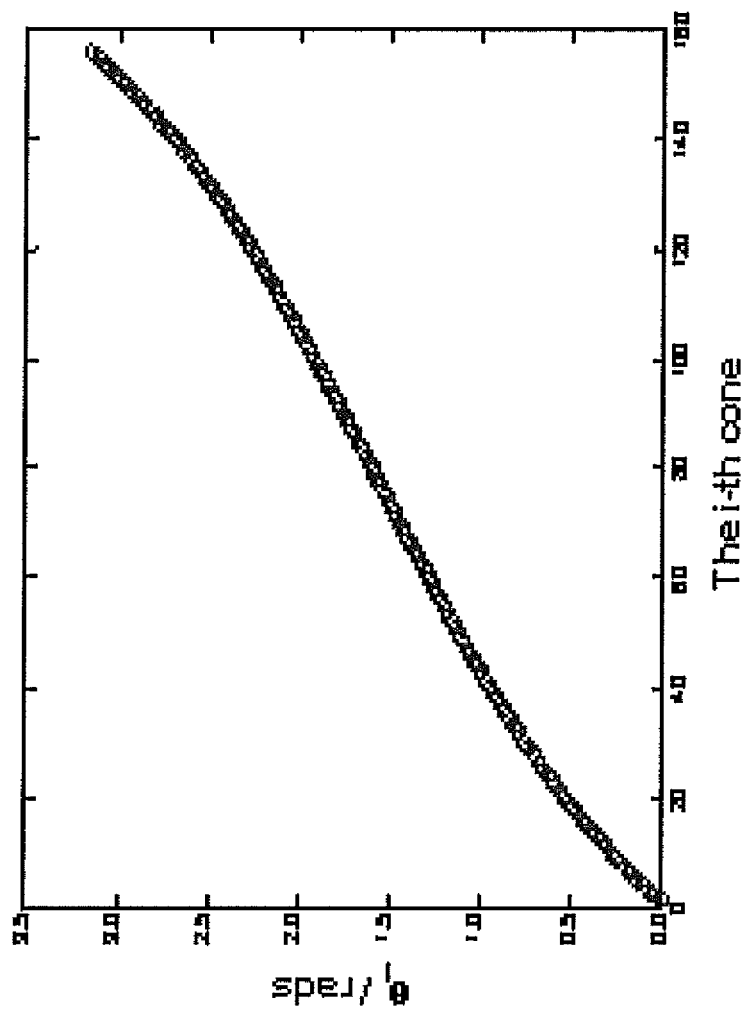
FIG. 5 illustrates distribution of cones in k-space comprising a particular oblate sphere volume, according to invention principles.

FIG. 5 illustrates distribution of cones in k-space comprising a particular oblate sphere volume. Specifically, FIG. 5 shows a distribution of the angle $\theta_i$ of the i-th cone plotted against cone number for the case with $L_x = 2L_z$. In this case the total number of cones needed is 156. Due to the different resolutions along $K_x$ and $K_z$, the distribution of $\theta_i$ versus i-th cone is not linear, which is different for the isotropic case.

Figure 6:
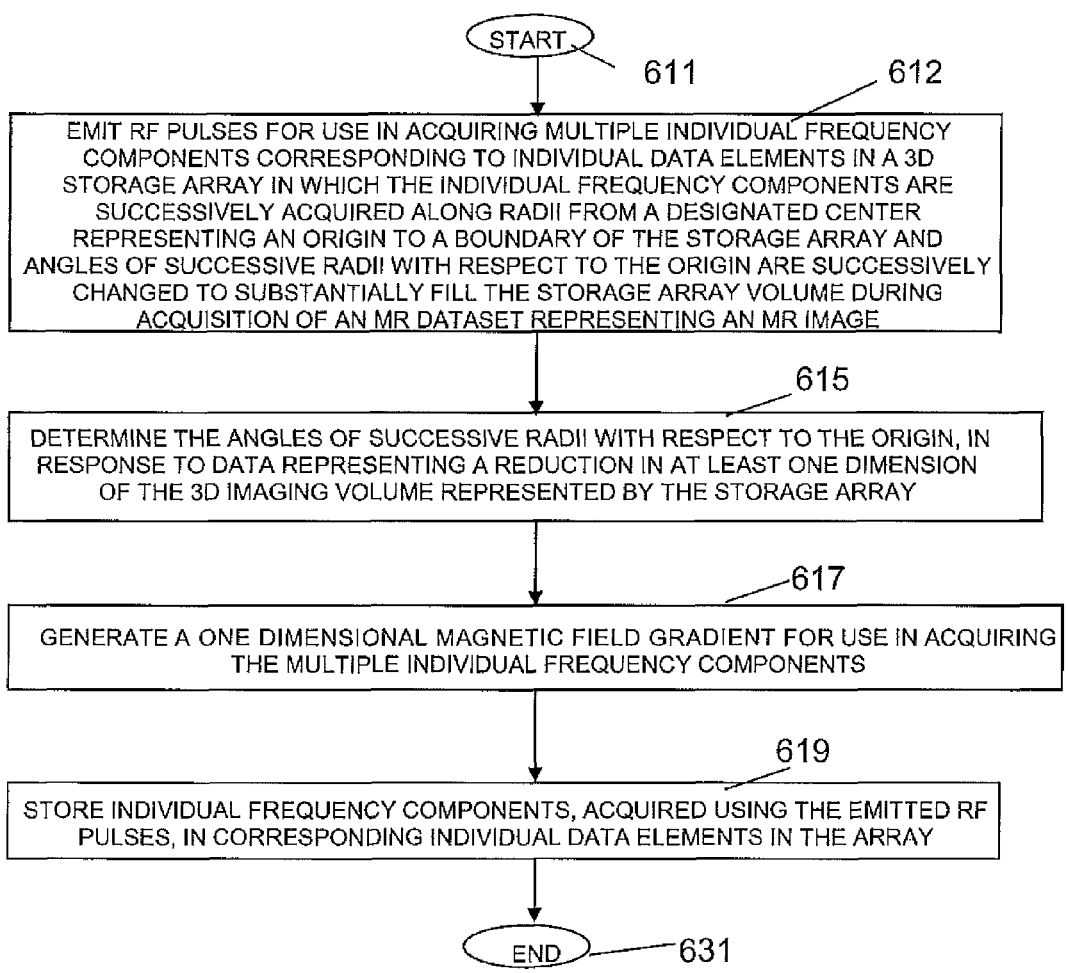
FIG. 6 shows a flowchart of a process performed by a system for acquiring frequency domain components representing MR image data for storage in an array, according to invention principles.

FIG. 6 shows a flowchart of a process performed by system 10 for acquiring frequency domain components representing MR image data for storage in an array. In step 612 following the start at step 611, RF coils 4 of system 10 emit RF pulses for use in acquiring multiple individual frequency components corresponding to individual data elements in a 3D (e.g., k-space) storage array in which the individual frequency components are successively acquired along radii from a designated center representing an origin to a boundary of the storage array and angles of successive radii with respect to the origin are successively changed to substantially fill the storage array volume during acquisition of an MR dataset representing an MR image. An individual frequency component comprises amplitude and phase data stored as a complex number in a corresponding individual data element in the storage array. Further, in one embodiment the successive radii are substantially linear. The 3D storage array of individual data elements stores corresponding individual frequency components comprising an MR dataset. The array of individual data elements has a designated center representing an origin and individual data elements individually have a radius to the designated center. In one embodiment, RF coils 4 emit RF pulses compatible with an MR imaging pulse sequence providing short Echo Time (TE) MR imaging having reduced resolution or slice thickness of an imaged volume in one axis.

A computation processor in system computer 20 of system 10 in step 615 determines the angles of successive radii with respect to the origin, in response to data representing a reduction in at least one dimension of the 3D imaging volume represented by the storage array. The computation processor dynamically determines the angles of successive radii by substantially uniformly distributing the angles along an ellipse in a 2D plane and by rotating radii around an axis in the plane to form a cone. The computation processor dynamically determines lengths of the successive radii from the designated center to a boundary of the storage array, in response to data representing a reduction in at least one dimension of the 3D imaging volume represented by the storage array. The computation processor dynamically determines lengths of the successive radii based on cone angle relative to Kz axis.

In step 617 magnetic coils of system 10 generate a one dimensional magnetic field gradient for use in acquiring the multiple individual frequency components. Controller 18 in step 619 directs storing individual frequency components, acquired using the emitted RF pulses, in corresponding individual data elements in the array. The process of FIG. 6 terminates at step 631.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Individual K-space components stored in data elements may be represented by a Fourier transform pair involving position (x,y) and spatial frequency ($k_{FE}$, $k_{PE}$), where $k_{FE}$ and $k_{PE}$ are, $$k_{FE} = \bar{e}G_{FE}m\Delta t$$

and $$k_{PE} = \bar{e}n\Delta G_{PE}T$$

and FE refers to frequency encoding, PE to phase encoding, $\Delta t$ is sampling time (the reciprocal of sampling frequency), T is the duration of $G_{PE}$, $\bar{e}$ is the gyromagnetic ratio, m is the sample number in the FE direction and n is the sample number in the PE direction (also known as partition number), $G_{PE}$ is the phase encoding gradient and $G_{FE}$ is the frequency encoding gradient. The 2D-Fourier Transform of this encoded signal results in a representation of the spin density distribution in two dimensions. K-space has the same number of rows and columns as the final image and during an imaging scan, k-space is filled with raw data one line per TR (Repetition Time).

The system and processes of FIGS. 1-6 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A magnetic field generator applies a magnetic field for use in acquiring multiple individual frequency components corresponding to individual data elements in a 3D k-space storage array in which the individual frequency components are successively acquired along linear trajectories from a designated k-space center to a boundary of k-space and angles between successive trajectories with respect to the origin are incrementally changed to substantially fill the k-space volume during acquisition of an MR dataset representing an MR image. Further, the processes and applications may, in alternative embodiments, be located on one or more (e.g., distributed) processing devices on a network linking the units of FIG. 1. Any of the functions and steps provided in FIGS. 1-6 may be implemented in hardware, software or a combination of both.

What is claimed is:

1. A system for acquiring frequency domain components representing MR image data for storage in an array, comprising:
an RF coil for emitting RF pulses for use in acquiring a plurality of individual frequency components corresponding to individual data elements in a 3D (three dimensional) storage array in which the individual frequency components are successively acquired along radii from a designated center representing an origin to a boundary of the 3D storage array and angles of successive radii with respect to the origin are successively changed to substantially fill the storage array volume during acquisition of an MR dataset representing an MR image;
a computation processor for determining said angles of successive radii with respect to the origin, in response to data representing a reduction in physical dimension in at least one direction of different imaging axes of a 3D imaging volume comprising said storage array; and
a storage processor for storing individual frequency components, acquired using the emitted RF pulses, in corresponding individual data elements in said storage array.

2. A system according to claim 1, wherein
said computation processor dynamically determines lengths of said successive radii from said designated center to a boundary of the storage array, in response to data representing a reduction in at least one dimension of the 3D imaging volume represented by the storage array.

3. A system according to claim 1, wherein
said successive radii are substantially linear.

4. A system according to claim 1, including
a magnetic field generator for generating a one dimensional magnetic field gradient for use in acquiring said plurality of individual frequency components.

5. A system according to claim 1, wherein
an individual frequency component comprises amplitude and phase data stored as a complex number in a corresponding individual data element in said storage array.

6. A system according to claim 1, wherein
said computation processor determines at least one of, (a) a resolution reduction factor and (b) a number of radial trajectories, "in response to said data representing a reduction in one or two dimensions of said 3D imaging volume and
said 3D storage array of individual data elements for storing corresponding individual frequency components comprises k-space.

7. A system for acquiring frequency domain components representing MR image data for storage in an array, comprising:
an RF coil for emitting RF pulses for use in acquiring a plurality of individual frequency components corresponding to individual data elements in a 3D (three dimensional) storage array in which the individual frequency components are successively acquired along radii from a designated center representing an origin to a boundary of the 3D storage array and angles of successive radii with respect to the origin are successively changed to substantially fill the storage array volume during acquisition of an MR dataset representing an MR image;
a computation processor for determining said angles of successive radii with respect to the origin, in response to data representing a reduction in at least one dimension of a 3D imaging volume represented by said storage array; and
a storage processor for storing individual frequency components, acquired using the emitted RF pulses, in corresponding individual data elements in said storage array, wherein
said angles of successive radii comprise uniformly distributed angles in a plane of said storage array and
said RF coil emits RF pulses compatible with an MR imaging pulse sequence providing short Echo Time (TE) MR imaging having reduced resolution or slice thickness of an imaged volume in one axis.

8. A system for acquiring frequency domain components representing MR image data for storage in an array, comprising:
an RF coil for emitting RF pulses for use in acquiring a plurality of individual frequency components corresponding to individual data elements in a 3D (three dimensional) storage array in which the individual frequency components are successively acquired along radii from a designated center representing an origin to a boundary of the 3D storage array and angles of successive radii with respect to the origin are successively changed to substantially fill the storage array volume during acquisition of an MR dataset representing an MR image;
a computation processor for determining said angles of successive radii with respect to the origin, in response to data representing a reduction in at least one dimension of a 3D imaging volume represented by said storage array; and
a storage processor for storing individual frequency components, acquired using the emitted RF pulses, in corresponding individual data elements in said storage array, wherein
said computation processor determines said angles of successive radii to provide image data acquisition with non-isotropic resolution and
said 3D storage array of individual data elements stores corresponding individual frequency components comprising an MR dataset, said array of individual data elements having a designated center representing an origin and individual data elements individually have a radius to said designated center.

9. A system for acquiring frequency domain components representing MR image data for storage in an array, comprising:
   an RF coil for emitting RF pulses for use in acquiring a plurality of individual frequency components corresponding to individual data elements in a 3D (three dimensional) storage array in which the individual frequency components are successively acquired along radii from a designated center representing an origin to a boundary of the 3D storage array and angles of successive radii with respect to the origin are successively changed to substantially fill the storage array volume during acquisition of an MR dataset representing an MR image;
   a computation processor for determining said angles of successive radii with respect to the origin, in response to data representing a reduction in at least one dimension of a 3D imaging volume represented by said storage array; and
      a storage processor for storing individual frequency components, acquired using the emitted RF pulses, in corresponding individual data elements in said storage array, wherein
   said computation processor dynamically determines said angles of successive radii by substantially uniformly distributing the angles along an ellipse in a 2D plane.

10. A system according to claim 9, wherein
   said computation processor dynamically determines said angles of successive radii by substantially uniformly distributing the angles along an ellipse in a 2D plane and by rotating radii around an axis in the plane to form a cone.

11. A system according to claim 10, wherein
   said computation processor dynamically determines lengths of said successive radii based on cone angle relative to Kz axis.

12. A system for acquiring frequency domain components representing MR image data for storage in an array, comprising:
   an RF coil for emitting RF pulses for use in acquiring a plurality of individual frequency components corresponding to individual data elements in a 3D (three dimensional) k-space storage array in which the individual frequency components are successively acquired along radii from a designated center representing an origin to a boundary of the k-space and angles of successive radii with respect to the origin are successively changed to substantially fill the k-space storage array volume during acquisition of an MR dataset representing an MR image;
   a computation processor for determining said angles of successive radii with respect to the origin, in response to data representing a reduction in physical dimension in at least one direction of different imaging axes of a 3D imaging volume comprising said k-space storage array;
   a magnetic field generator for generating a one dimensional magnetic field gradient for use in acquiring said plurality of individual frequency components; and
   a storage processor for storing individual frequency components, acquired using the emitted RF pulses, in corresponding individual data elements in said storage array.

13. A method for acquiring frequency domain components representing MR image data for storage in an array, comprising the activities of:
   emitting RF pulses for use in acquiring a plurality of individual frequency components corresponding to individual data elements in a 3D (three dimensional) storage array in which the individual frequency components are successively acquired along radii from a designated center representing an origin to a boundary of the 3D storage array and angles of successive radii with respect to the origin are successively changed to substantially fill the storage array volume during acquisition of an MR dataset representing an MR image;
   determining said angles of successive radii with respect to the origin, in response to data representing a reduction in physical dimension in at least one direction of different imaging axes of the 3D imaging volume comprising said storage array; and
   storing individual frequency components, acquired using the emitted RF pulses, in corresponding individual data elements in said storage array.

* * * * *